(12) United States Patent
Powney et al.

(10) Patent No.: US 11,224,121 B2
(45) Date of Patent: Jan. 11, 2022

(54) ASSEMBLY FOR ELECTRO-MAGNETIC INTERFERENCE SHIELDING AND METHOD

(71) Applicant: Huawei Technologies Co., Ltd., Shenzhen (CN)

(72) Inventors: David Powney, Kista (SE); Sami Maattanen, Helsinki (FI)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/971,913

(22) PCT Filed: Mar. 16, 2018

(86) PCT No.: PCT/EP2018/056707
§ 371 (c)(1),
(2) Date: Aug. 21, 2020

(87) PCT Pub. No.: WO2019/174748
PCT Pub. Date: Sep. 19, 2019

(65) Prior Publication Data
US 2021/0105890 A1    Apr. 8, 2021

(51) Int. Cl.
*H05K 1/02*        (2006.01)
*H05K 1/18*        (2006.01)
*H05K 3/00*        (2006.01)

(52) U.S. Cl.
CPC ............. *H05K 1/023* (2013.01); *H05K 1/028* (2013.01); *H05K 1/183* (2013.01); *H05K 3/005* (2013.01);
(Continued)

(58) Field of Classification Search
CPC ....... H05K 1/0218–0227; H05K 1/023; H05K 1/028; H05K 2201/0715; H05K 1/10128;
(Continued)

(56) References Cited

U.S. PATENT DOCUMENTS 8,847,184 B2   9/2014   Cheng et al.
9,030,841 B2   5/2015   Arnold et al.
(Continued)

FOREIGN PATENT DOCUMENTS

CN    1219095 A    6/1999
CN    1303085 A    7/2001
(Continued)

*Primary Examiner* — Hoa C Nguyen
(74) *Attorney, Agent, or Firm* — Conley Rose, P.C.

(57) ABSTRACT

An assembly comprises a flexible circuit board (FCB) having a substrate with a top side, and a circuit pattern layer on the top side of the substrate. The circuit pattern layer has a connection region for facilitating electrical interconnection to the FCB, and one or more cavities extending through both the substrate and the circuit pattern layer. A first conductive layer for electro-magnetic interference (EMI) shielding is positioned on a top side of the FCB, and a second conductive layer for EMI shielding is positioned on a back side of the FCB. Electrically conductive adhesive extends through the one or more cavities for electrically connecting the first conductive layer and the second conductive layer. The electrically conductive adhesive further extends from the first conductive layer to the connection region for facilitating electrical interconnection of the first conductive layer and the second conductive layer.

20 Claims, 5 Drawing Sheets

(52) U.S. Cl.
CPC ............... *H05K 2201/0715* (2013.01); *H05K 2201/10128* (2013.01)

(58) Field of Classification Search
CPC .... H05K 9/0022; H05K 9/0024; H05K 9/003; H05K 9/0039; H05K 9/0081; H05K 9/0088; H05K 9/0098
USPC ................................................ 361/816, 818
See application file for complete search history.

(56) References Cited

U.S. PATENT DOCUMENTS

| | | | |
|---|---|---|---|
| 9,179,538 B2 | 11/2015 | Foster et al. | |
| 9,601,445 B2 | 3/2017 | Park et al. | |
| 9,713,255 B2 | 7/2017 | Elsherbini et al. | |
| 2008/0202807 A1* | 8/2008 | Wesselman | H05K 1/0221 174/388 |
| 2008/0296048 A1* | 12/2008 | Muro | H05K 1/0218 174/254 |
| 2009/0038839 A1* | 2/2009 | Hashimoto | H05K 1/0218 174/350 |
| 2009/0218117 A1* | 9/2009 | Sakai | H05K 3/44 174/254 |
| 2011/0162864 A1 | 7/2011 | Kaneda et al. | |
| 2012/0139655 A1 | 6/2012 | Lin et al. | |
| 2013/0180762 A1 | 7/2013 | Moul et al. | |
| 2014/0307396 A1* | 10/2014 | Lee | H05K 1/028 361/749 |
| 2016/0148881 A1* | 5/2016 | Park | H01L 23/145 257/659 |

FOREIGN PATENT DOCUMENTS

| | | |
|---|---|---|
| CN | 101176388 A | 5/2008 |
| CN | 203896586 U | 10/2014 |
| CN | 204810807 U | 11/2015 |
| CN | 206323636 U | 7/2017 |
| JP | 3498386 B2 | 2/2004 |
| JP | 2017017327 A | 1/2017 |
| KR | 20170012536 A | 2/2017 |
| TW | 200819035 A | 4/2008 |
| TW | I306389 B | 2/2009 |
| WO | 2010038782 A1 | 4/2010 |
| WO | 2011067945 A1 | 6/2011 |

\* cited by examiner

ASSEMBLY FOR ELECTRO-MAGNETIC INTERFERENCE SHIELDING AND METHOD

CROSS-REFERENCE TO RELATED APPLICATIONS

This application is a U.S. National Stage of International Patent Application No. PCT/EP2018/056707 filed on Mar. 16, 2018, which is hereby incorporated by reference in its entirety.

TECHNICAL FIELD

The present application relates to electro-magnetic interference (EMI) shielding of a flexible circuit board (FCB) and, more particularly, to EMI shielding of a single metal layer FCB.

BACKGROUND

Electrical circuit components are often sensitive to electro-magnetic interference. On the other hand, the components themselves produce emissions of electromagnetic waves, which affect other components. For tightly-packed modern electronics, various methods have been developed to provide electromagnetic shielding.

Flexible circuit boards may be used in tightly-packed electrical devices to allow compact structural design. For a single metal layer FCB it is however always not that straightforward to make shielding connections that would allow all around shielding of the FCB. For example, a grounding connection for shielding may not readily be available.

As the number of connections and components packed in a given volume in electrical devices increases, new types of shielding methods are required so that the shielding may be both adapted to various applications and structures, and be manufactured in a reliable and cost-efficient manner, for example in automated mass production.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide an assembly for electro-magnetic interference (EMI) shielding of a flexible circuit board (FCB). The foregoing and other objects are achieved by the features of the independent claims. Further implementation forms are apparent from the dependent claims, the description and the figures.

According to a first aspect an assembly for EMI shielding of a FCB is provided. The FCB comprises a substrate for supporting the structures such as electrical circuitry formed on the FCB. The substrate has a top side and a back side, which are located on opposite sides of the substrate. Generally, an FCB and the substrate therein are flexible, board-like structures, having width and length larger than thickness so that the top side and the back side of the substrate are located on the opposite sides of the substrate with respect to the dimension defining the thickness of the substrate, hereby defined as the z-dimension. The top side and the back side of the substrate may further be defined to correspond to the top side and back side of the FCB itself. The definition is made here to distinguish the FCB from flexible circuit boards having electrical circuitry on both sides of the substrate, i.e. on the top side and the back side. Here, most or all of the circuitry may specifically be formed on one side, i.e. on the top side of the substrate. Consequently, the FCB may be a single metal layer FCB.

The FCB thereby further comprises a circuit pattern layer on the top side of the substrate. The circuit pattern layer is a layer of conductive material and it has a connection region, for example one or more connection regions, for facilitating an electrical interconnection to the FCB, for example a grounding connection, i.e. for establishing a direct or indirect electrical connection to the FCB. The FCB also has one or more cavities extending through both the substrate and the circuit pattern layer for providing a pass-through connection through the FCB. The one or more cavities may be through holes but some or all of them may also be pass-through connections with an open side, i.e. one facing perpendicularly to the z-dimension.

In addition, the FCB may comprise an insulating layer for providing electrical insulation of the circuit pattern layer. The insulating layer may be positioned on top of the circuit pattern layer and/or the substrate. The one or more cavities may extend also through the insulating layer for providing a pass-through connection through the FCB.

The FCB is positioned between two EMI shields, which may be formed as relatively thin films. The first shield is positioned on top of the FCB and it may comprise a first conductive layer for EMI shielding. The second shield is positioned on the back of the FCB and it may comprise a second conductive layer for EMI shielding. Either or both conductive layers may be metallic layers, for example formed by a deposition process on the corresponding EMI shield.

The assembly further comprises electrically conductive adhesive extending through the one or more cavities of the FCB for electrically connecting the first conductive layer and the second conductive layer. The electrically conductive adhesive attaches the first conductive layer to the FCB, on the top side, and it may fill most or all of the space between the first conductive layer and the FCB. Optionally, the electrically conductive adhesive may also attach the second conductive layer to the FCB, on the back side of the substrate. Alternatively, the second conductive layer may be attached to the substrate by different adhesive which may be electrically conductive adhesive or non-conductive adhesive. The electrically conductive adhesive also extends from the first conductive layer to the connection region of the FCB for facilitating an electrical interconnection, such as a grounding connection, for the first conductive layer and the second conductive layer. The electrically conductive adhesive may be applied separately or it may be part of the first and/or second EMI shield. In particular, the electrically conductive adhesive being part of either or both of the EMI shields allows easy, fast and cost-effective fabrication since either or both of the EMI shields may be pressed on the FCB so that the electrically conductive adhesive on the surface of the EMI shield contacts the FCB attaching the EMI shield to FCB. Furthermore, this allows the electrically conductive adhesive of the EMI shield to extend into the one or more of the cavities and electrically connect the connection region of the FCB and the second conductive layer through the electrically conductive adhesive and, optionally, the first conductive layer. The electrical connection from the electrically conductive adhesive to the second conductive layer may be direct, i.e. such that the electrically conductive adhesive of one EMI shield, e.g. the first EMI shield extends all the way through the cavities and contacts the second conductive layer of the second EMI shield directly. Alternatively, the connection may be indirect, e.g. so that both the first and the second EMI shield comprise a layer of electrically conductive adhesive which directly contact each other to form an electrically conductive connection between the first and the second conductive layer. For this purpose, either or both the electrically conductive adhesive of the first and the second shield may extend into the one or more cavities.

The adhesive on the second EMI shield may be the same or different adhesive as that on the first EMI shield. The adhesive on the second EMI shield may be either conductive or non-conductive.

In a further implementation form, the FCB is a chip-on-flex (COF) film. This allows the assembly to be used in various applications including display circuitry.

In a further implementation form, at least the part of the electrically conductive adhesive that is located between the circuit pattern layer of the FCB and the first conductive layer consists of anisotropic conductive adhesive (ACA). The ACA may be conductive in the z-dimension only. This allows avoiding short circuits in the circuit pattern layer, for example due to pin holes formed in the insulating layer of the FCB. This may be accomplished by using a first EMI shield having a layer of ACA on its surface for attaching the first EMI shield to the FCB and electrically connecting the first conductive layer to the circuit pattern layer at the connection region.

In a further implementation form, the electrically conductive adhesive is anisotropic conductive adhesive (ACA). This means that the whole conductive path from the first conductive layer to the second conductive layer is formed by the same ACA so that the properties of the contact may be regulated easily. In particular, the ACA connecting the two conductive layers may be formed by using a first EMI shield having a layer of ACA on its surface for attaching the first EMI shield to the FCB, from the top side, wherein the first EMI shield is pressed on the FCB so that the ACA extends from the first conductive layer all the way to the second conductive layer, through the one or more cavities. This allows the adhesive of the first EMI shield to make a direct contact to the second conductive layer, which may at least under some conditions improve the contact in comparison to a situation where a conductive path is formed through a contact between two adhesives.

In a further implementation form, the electrically conductive adhesive is isotropic conductive adhesive (ICA). This may be used for example when the risk of pinholes is not significant. As an example, the ICA connecting the two conductive layers may be formed by using a first EMI shield having a layer of ICA on its surface for attaching the first EMI shield to the FCB, from the top side, and a second EMI shield having a layer of ICA on its surface for attaching the second EMI shield to the back side of the substrate. Either or both of the two layers of ICA may then extend into the one or more cavities for electrically connecting the ICA on the first EMI shield to the ICA of the second EMI shield so that an electrical connection between the connection region and the second conductive layer is formed, through the adhesives and, optionally, the first conductive layer.

In a further implementation form, the second conductive layer is attached to the back side of the substrate with isotropic conductive adhesive (ICA). This allows, for example, using ICA on the back side of the FCB where there is no circuit pattern layer and consequently no risk for short circuits, while using ACA on the top side of the FCB to prevent short circuits in the circuit pattern layer. The ICA attaching the second conductive layer to the back side of the substrate may be formed on the surface of the second EMI shield so that the second EMI shield may be easily attached to the substrate by lamination and by the layer of ICA formed between the second conductive layer and the back side of the substrate.

In a further implementation form, the second conductive layer is attached to the back side of the substrate with non-conductive adhesive wherein the non-conductive adhesive has one or more cavities that align with the one or more cavities of the FCB. This allows more flexibility for application specific selection of the adhesive on the back side of the substrate since conductive adhesive is not necessary to be used. The one or more cavities of the non-conductive adhesive allow the conductive adhesive, which may be formed on the surface of the first EMI shield, to extend from the first conductive layer all the way to the second conductive layer. The non-conductive adhesive may be formed on the surface of the second EMI shield so that the second EMI shield may be easily attached to the substrate by lamination and by the layer of non-conductive adhesive formed between the second conductive layer and the back side of the substrate.

In a further implementation form, the first conductive layer comprises an opening for an electronic component attached to the circuit pattern layer of the FCB. This allows also such electronic components to be used, which have height larger than the thickness of the conductive adhesive between the first conductive layer and the circuit pattern layer. The electronic component, such as a display driver, may be attached on the circuit pattern layer of the FCB. Naturally, there is also an aligned opening all the layers between the first conductive layer and the circuit pattern layer, including the insulating layer of the FCB and the conductive adhesive, to allow the electronic component to extend through the opening in the first conductive layer while attached to the circuit pattern layer. When the first EMI shield comprises additional layers, also these may comprise an opening aligned with the opening in the first conductive layer for allowing the electronic component to extend through the first EMI shield.

In a further implementation form, the assembly comprises an electronic component, such as a display driver, attached to the circuit pattern layer of the FCB. The electronic component may be covered by the electrically conductive adhesive and the first conductive layer for EMI shielding of the electronic component. This allows simple shielding for small electronic components, for example by laminating a first EMI shield having conductive adhesive on its surface on top of an FCB having the electric component attached thereon.

In a further implementation form, the one or more cavities of the FCB comprises at least two cavities positioned on opposite sides of the electronic component. This allows directing the electromagnetic field around the electronic component favorably in terms of electromagnetic shielding.

In a further implementation form, the electrically conductive adhesive is formed from a pressure-sensitive material suitable for lamination on the FCB. This allows fast, reliable and cost-effective fabrication. Pressure-sensitive material is defined here as material, for which conductivity and/or adhesion are specifically brought about by the pressure exerted on the material. For example, such material may be pressure-sensitive adhesive (PSA) or temperature-sensitive adhesive (TSA), where the latter additionally has temperature as a trigger parameter in addition to pressure. The material withstands pressure, and specifically activates once a threshold pressure is exceeded, so that it can be laminated on the FCB as a part of a composite EMI shield. Also the EMI shield may be adapted to maintain its integrity for providing the EMI shielding and electrically conductive linking to the other electrically conductive layer and to the circuit pattern layer after lamination. Consequently, also the EMI shield comprising the pressure-sensitive adhesive can be defined as pressure-sensitive. The first conductive layer and/or the second conductive layer may each be individually formed as a part of an EMI shield, which may be a composite structure. In addition to the conductive layer, the EMI shield may comprise at least an adhesive layer on its outer surface and/or an insulating layer. For example, the EMI shield may consist of or comprise three layers with a conductive layer such as a metal film sandwiched between an insulating layer and a layer of adhesive, which may be electrically conductive adhesive, such as ICA or ACA, or non-conductive adhesive.

In a further implementation form, the one or more cavities of the FCB are punched cavities. This allows consistent properties for the cavities, such as size and/or shape, since they can be fabricated with a single die having the desired properties. Punched cavities, such as through-holes, have a clean, well-defined profile with no residue from the host material allowing, for example, the conductive adhesive filling the cavities to enter freely without forming empty spots or other imperfections affecting the conductive properties of the electrical connection. This is particularly advantageous, when the holes are to be made small, e.g. 0.5-5 millimeters in diameter.

In a further implementation form, the one or more cavities of the FCB are circular. This may be used to improve the filling of the cavities by conductive adhesive, particularly when the electrical connection through the cavity is formed by pressing, e.g. by lamination of the first and/or the second EMI shield, including the first and/or second conductive layers, on the FCB.

In a further implementation form, the one or more cavities of the FCB are positioned on an outer edge of the FCB partially overlapping the outer edge. This allows further flexibility in design and construction of the assembly. For example, the cross-sectional area of the cavities may be optimized and/or the overlap with the circuits on the circuit pattern layer may be avoided. Additionally, a cavity partially overlapping the outer edge of the FCB may also prevent voids or air bubbles during the EMI shield pressing or lamination step during which the conductive adhesive is driven through the cavity.

According to a second aspect, a display module comprises the assembly of the first aspect or any combination of its further implementation forms. The display module also comprises a display panel and a display driver integrated circuit (DDIC) attached to the circuit pattern layer of the FCB. The FCB is coupled to the display panel, through a coupling region, so that the top side of the substrate faces the display panel and the back side of the substrate faces away from the display panel. The FCB may be bent, e.g. substantially 180 degrees, around an edge of the display panel, including any of its components such as the backlight unit, so that the coupling region and the DDIC are on the opposite sides of the display panel, i.e. on the front side and the back side, in this order. This way, the FCB may substantially extend behind the display panel for efficient use of space. The construction of the shielding assembly allows the EMI shielding to cover both sides of the FCB. Moreover, both the first and the second conductive layer providing the EMI shielding can obtain an electrical interconnection such as a grounding connection through the FCB by the means of the connection region on the circuit pattern layer. This may notably improve the shielding in comparison to configurations, where interconnections such as grounding connections need to be made through external circuits such as the main FCB, e.g. main flexible printed circuit (FPC), of the display. In contrast, the construction of the shielding assembly allows the shielding to be embedded to the FCB of the assembly itself. This may significantly shorten the distance required for the interconnection, thereby reducing the impedance and, consequently, improving shielding efficiency. Additionally, the disclosed construction allows the shielding to be embedded into the FCB so that it can be formed early in the manufacturing process. In comparison, when the shielding is not embedded and one or more conductive layers for EMI shielding require a direct external connection, the shielding typically needs to be performed as the last step of the display module manufacturing process, increasing the risk to damage the display module or to cause quality degradation such as white spots.

According to a third aspect, a method for EMI shielding of an FCB is disclosed. The method may be part of a manufacturing process of an electronic device, for example manufacturing a display module in accordance with the second aspect. The FCB comprises a substrate having a top side and a back side, a circuit pattern layer on the top side of the substrate, the circuit pattern layer having a connection region for facilitating an electrical interconnection for the FCB, and one or more cavities extending through both the substrate and the circuit pattern layer. The method comprises laminating a second EMI shielding film on the back side of the substrate and laminating a first EMI shielding film comprising electrically conductive adhesive on top of the FCB so that the electrically conductive adhesive extends into the one or more cavities of the FCB and electrically connects the first conductive layer and the second conductive layer; and so that the electrically conductive adhesive also extends from the first conductive layer to the connection region of the FCB for facilitating an electrical interconnection for the first conductive layer and the second conductive layer. The first and the second EMI shielding film may be laminated simultaneously. Alternatively, the second EMI shielding film may be laminated first, in particular when the method includes laminating the first EMI shielding film in such a way that the electrically conductive adhesive extends all the way from the first conductive layer to the second conductive layer. This allows ensuring that the electrical connection can be made also when only the first EMI shielding films provides conductive adhesive extending into the cavities. Naturally, when also the second EMI shielding film comprises conductive adhesive for extending in into the one or more cavities of the FCB and electrically connecting the first conductive layer and the second conductive layer, it is possible to laminate either one of the first and the second EMI shield first. The first and/or second EMI film may correspond to the first and/or second EMI shields as described above in connection with the first aspect and, correspondingly, they may be composite structures having multiple layers including an adhesive layer and/or an insulating layer.

In a further implementation form, the method comprises step of forming the one or more cavities of the FCB by punching. Naturally, this step is performed prior to lamination of the EMI shields. This allows fast and cost efficient manufacturing while accurately controlling the properties of the cavities. The punching may be performed at any time before the EMI shields are to be laminated but typically they can be formed during the bare FCB production process before any assembly.

In a further implementation form, the second EMI shielding film comprises non-conductive adhesive. The method then comprises arranging one or more cavities into the non-conductive adhesive matching with the one or more cavities of the FCB and aligning the one or more cavities of the second EMI shielding film with the one or more cavities of the FCB for lamination. The lamination is performed so that the conductive adhesive of the first EMI shielding film extends through the one or more cavities all the way from the first conductive layer to the second conductive layer. This allows also non-conductive adhesive to be used while still allowing the electrical connection between the second conductive layer and the connection region to be formed.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Figure 1A:
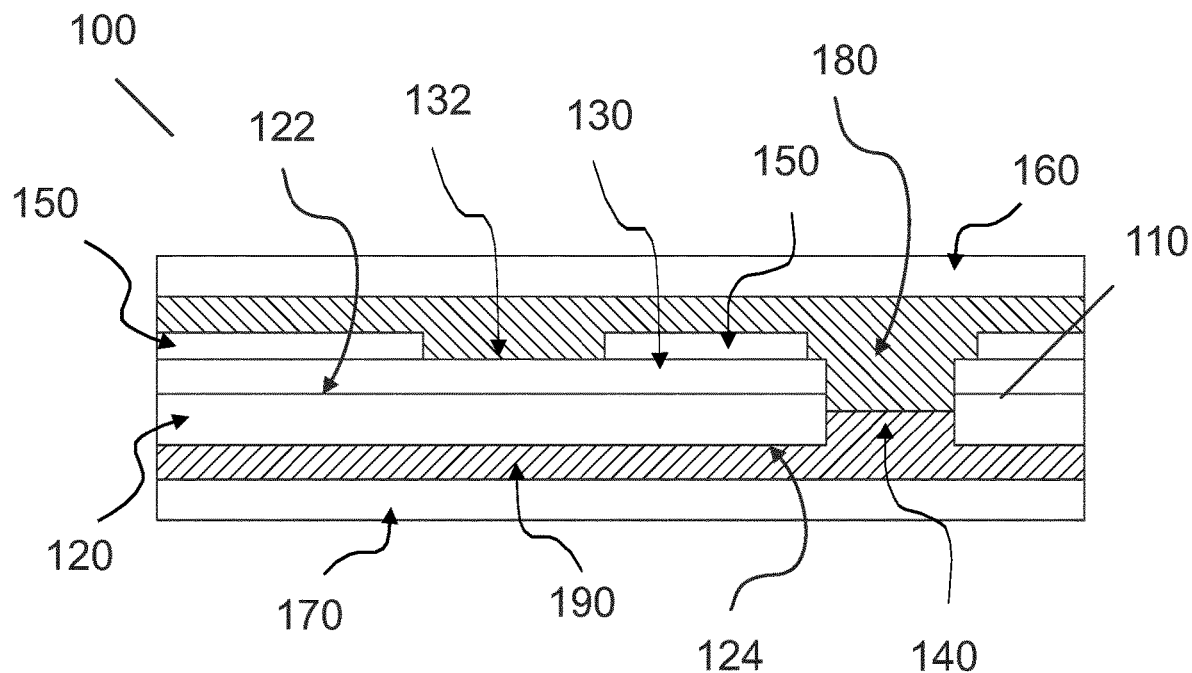
FIGS. 1*a-b* illustrate schematic representations of assemblies for EMI shielding in a cross-sectional view.

Like references are used to designate like parts in the accompanying drawings. The cross-sections are taken in a plane parallel to the z-axis, i.e. in the dimension defining the thickness of the assembly for EMI shielding and corresponding to the vertical dimension in the drawings. It is to be understood that, the drawings of FIGS. 1-3 are intended to illustrate the layered structure of the assembly for EMI shielding. Correspondingly, unless indicated otherwise, the assemblies shown are confined only in the z-dimension. They may therefore extend horizontally also beyond what is illustrated in the drawings.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

FIG. 1*a* illustrates a schematic representation of an assembly 100 for EMI shielding according to an example. The assembly 100 comprises a FCB 110, for example a flexible printed circuit (FPC) or a chip-on-flex (COF) film. The FCB 110 is a single-layer FCB, i.e., it has a conductive layer for circuit patterning only on one side. The FCB 110 is a substantially two-dimensional plate-like structure with thickness smaller than the length and the width and it may be relatively thin, for example less than one or two millimeters. It may be substantially flat. The FCB 110 is formed as a layered structure comprising a substrate 120 as a support layer and a circuit pattern layer 130 as a layer of conductive material such as metal, e.g. copper, where electrical circuitry is patterned. The substrate 120 may be of non-conductive material, for example of polymer material such as polyimide or polyester. The substrate 120 comprises a top side 122 and a back side 124, on the opposite sides with respect to the z-dimension, and these are correspondingly used to define also the top side and the back side of the FCB 110. The circuit pattern layer 130 is located on the top side 122 of the substrate 120 and it may be directly deposited on the substrate 120. The back side 124 of the substrate 120 may be completely free of circuitry and/or any other conductive layering. The circuit pattern layer 130 comprises electrical circuitry and/or electrical interconnections. The circuit pattern layer 130 also comprises one or more connection region 132 for facilitating an electrical interconnection to and from the FCB 110. This can be, for example, a grounding connection of the FCB 110. The FCB 110 may further comprise an insulating layer 150, which may be located on top of the circuit pattern layer 130. The insulating layer 150 may be adapted for providing internal and/or external electrical insulation for the circuit pattern layer 130. It may comprise or consist of, for example, solder resist. The insulating layer 150 may be very thin, for example 5-50 microns. It may be adapted to insulate individual circuit patterns of the circuit pattern layer 130 from one another, which may involve insulating hundreds or thousands of individual line patterns in the x-y-plane. The insulating layer 150 may comprise openings or be partially removed to partially expose the circuit pattern layer 130, particularly the connection region 132, for allowing an electrically conductive connection to be formed. As an example, the FCB 110 may be formed as a flexible copper-clad laminate (FCCL).

Additionally, the FCB 110 comprises one or more cavities 140, which extend through the whole FCB 110 in the z-dimension. The one or more cavities 140 are large enough to allow conductive adhesive to be pressed through them to reliably form an electrically conductive connection from the top side of the FCB 110 to the back side of the FCB 110. On the other hand, they may be made as small as possible to conserve space on the FCB 110 and the circuit pattern layer 130 in particular. For example, the one or more cavities 140 may have a diameter of 0.5-5 millimeters. The one or more cavities 140 may be through-holes but some or all of them may also be located on the side of the FCB 110, in which case these side cavities may be open cavities with an open side facing perpendicularly to the z-axis. The one or more cavities 140 may have, for example, a round or an oval shape. In particular, they may be circular. The one or more cavities 140 may be punched cavities, in which case they can be fabricated using a die whose properties such as shape and size are adapted for producing cavities with desired properties. For example, increasing the size of the cavities makes the fabrication of the die easier, increases its lifetime and thereby improves the reliability with which cavities of desired characteristics can be made on the densely-packed FCB 110. While other methods such as laser ablation can also be used for making the cavities 140, punched cavities have a particular advantage of clean and smooth profile, which in turn is advantageous in producing reliable electrically conductive connections through the FCB 110.

In the shielding assembly, the FCB 110 is sandwiched between two electrically conductive layers 160, 170. Each of the layers 160, 170 may be part of an EMI shield, which may be a composite structure. An EMI shield comprises at least the electrically conductive layer 160, 170 but it may be a multi-layered structure comprising, for example, an electrically conductive layer and a layer of conductive or non-conductive adhesive on its surface. Optionally, the EMI shield may further comprise an insulating layer, for example on the opposite side of the conductive layer 160, 170 with respect to the layer of adhesive. The EMI shield, including the electrically conductive layer 160, 170, may be a film having relatively small thickness, e.g. less than that of the FCB 110 or less than one millimeter. Either or both of the electrically conductive layers 160, 170 may be metallic, e.g. a metal film or deposited metal layer. A first EMI shield comprising a first electrically conductive layer 160 is positioned on top of the FCB 110 and it may be arranged to cover the FCB 110 across its transverse dimension. It may also be arranged to cover the FCB 110 along a part, most or substantially all of the longitudinal dimension of the FCB 110. A second EMI shield comprising a second electrically conductive layer 170 is positioned on the back of the FCB 110 and it may also be arranged to cover the FCB 110 across its transverse dimension. It may also be arranged to cover the FCB 110 along a part, most or substantially all of the longitudinal dimension of the FCB 110.

The first conductive layer 160 is attached to the FCB 110 by a layer of first adhesive 180, which may be part of the first EMI shield. The layer of first adhesive 180 may fill most or substantially all of the space between the first conductive layer 160 and the FCB 110. This may be achieved by laminating an EMI shield having a continuous layer of adhesive on its surface on top of the FCB 110. The first adhesive 180 is electrically conductive so that it may electrically connect the first conductive layer 160 to the circuit pattern layer 130 and particularly the connection region 132. The first adhesive 180 may be isotropic conductive adhesive (ICA), in which case it is electrically conductive in all directions. Alternatively, the first adhesive 180 may be anisotropic conductive adhesive (ACA), in which case the directions for electrical conductivity are limited. In particular, the electrical conductivity may be limited substantially into z-dimension. This allows preventing short circuits, for example due to pin holes in the insulating layer 150 of the FCB 110.

The second conductive layer 170 may also be attached to the FCB 110 by a layer of second adhesive 190, which may be part of the second EMI shield. The layer of second adhesive 190 may fill most or substantially all of the space between the second conductive layer 170 and the back side of the FCB 110, e.g. the back side 124 of the substrate 120. This may be achieved by laminating a second EMI shield having a continuous layer of adhesive on its surface on the back side of the FCB 110, e.g. on the back side 124 of the substrate 120. The second adhesive 190 may be the same as that of the first adhesive 180. The second adhesive 190 is also electrically conductive so that it may electrically connect to the first adhesive 180 for forming an electrically conductive connection from the second conductive layer 170 through the adhesives 180, 190 to the connection region 132, optionally through the first conductive layer 160. The first adhesive 180 may be ICA or ACA, particularly ACA having electrical conductivity limited substantially into z-dimension. The first adhesive 180 and/or the second adhesive 190 extends into the one or more cavities 140 for forming the electrically conductive connection between the first adhesive 180 and the second adhesive 190. This may be accomplished by pressure e.g. during lamination.

The first adhesive 180 and/or the second adhesive 190 may be pressure-sensitive. Consequently, either or both of the EMI shields, including the adhesive 180, 190, may be pressure-sensitive.

Figure 1B:
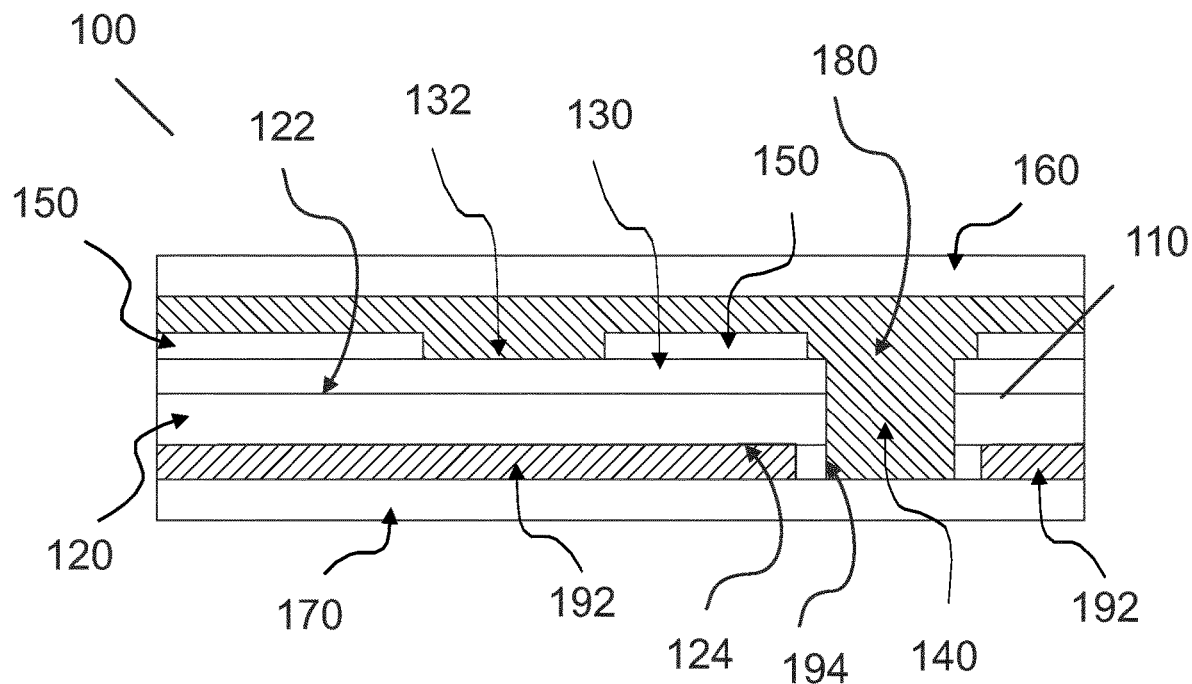

FIG. 1b illustrates a schematic representation of an assembly 100 for EMI shielding according to another example.

The assembly 100 and its alternatives are otherwise as described above, but here the first adhesive 180 extends all the way from the first conductive layer 160, through the one or more cavities 140, to the second conductive layer 170. Making a direct contact with the first adhesive 180 to the second conductive layer 170 may improve the electric connection between the connection region 132 and the second conductive layer 170 and/or make forming it easier. This way, it may also allow reducing the diameter of the one or more cavities 140. This adhesive geometry also allows using also non-conductive adhesive 192 for the second adhesive 190. Naturally, conductive adhesive such as ICA or ACA may be use also in this example to replace the non-conductive adhesive 192 but it is no longer necessary since the back side of the FCB 110 can be completely devoid of circuitry. In this example, the second adhesive, e.g. the non-conductive adhesive 192, comprises one or more cavities 194 which expose the surface of the second conductive layer 170 for electrically conductive connection. The size of the one or more cavities 194 may be the same as the size of the one or more cavities of the FCB 110 but the size may be even larger to ensure that the second adhesive does not impair the electrically conductive connection to the second conductive layer 170.

Figure 2A:
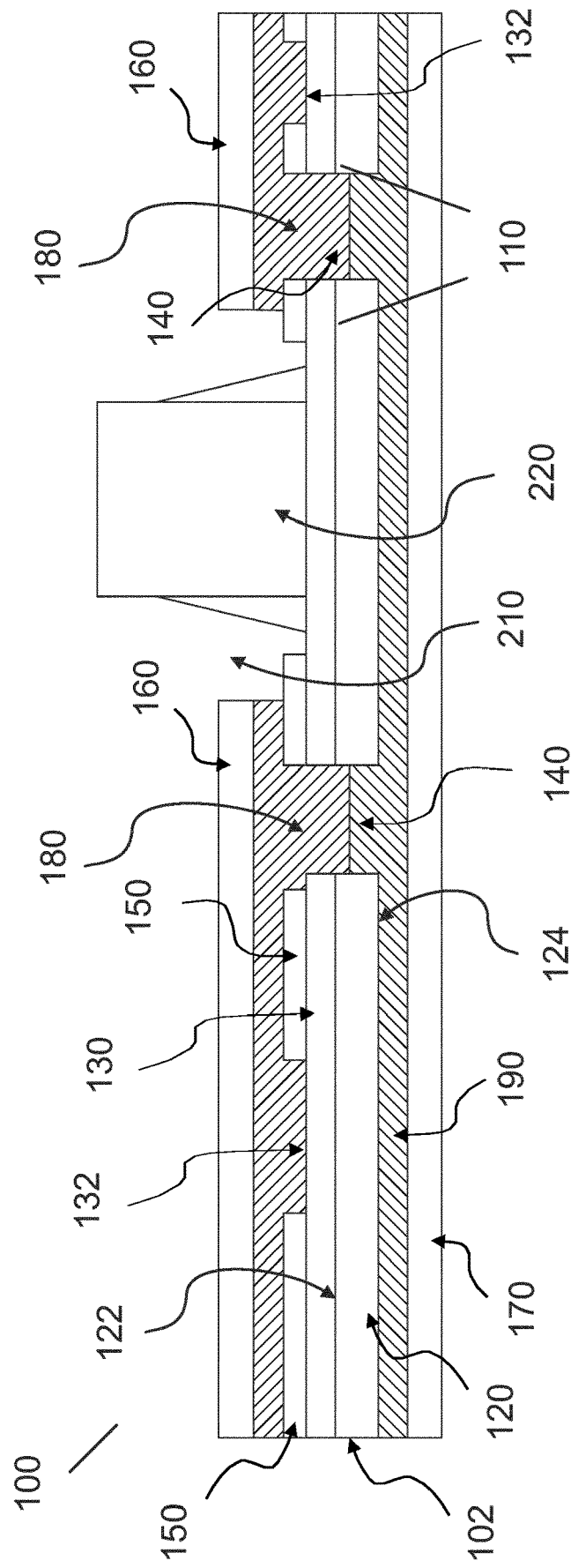
FIGS. 2*a-b* illustrate additional schematic representations of assemblies for EMI shielding in a cross-sectional view.
Figure 3:
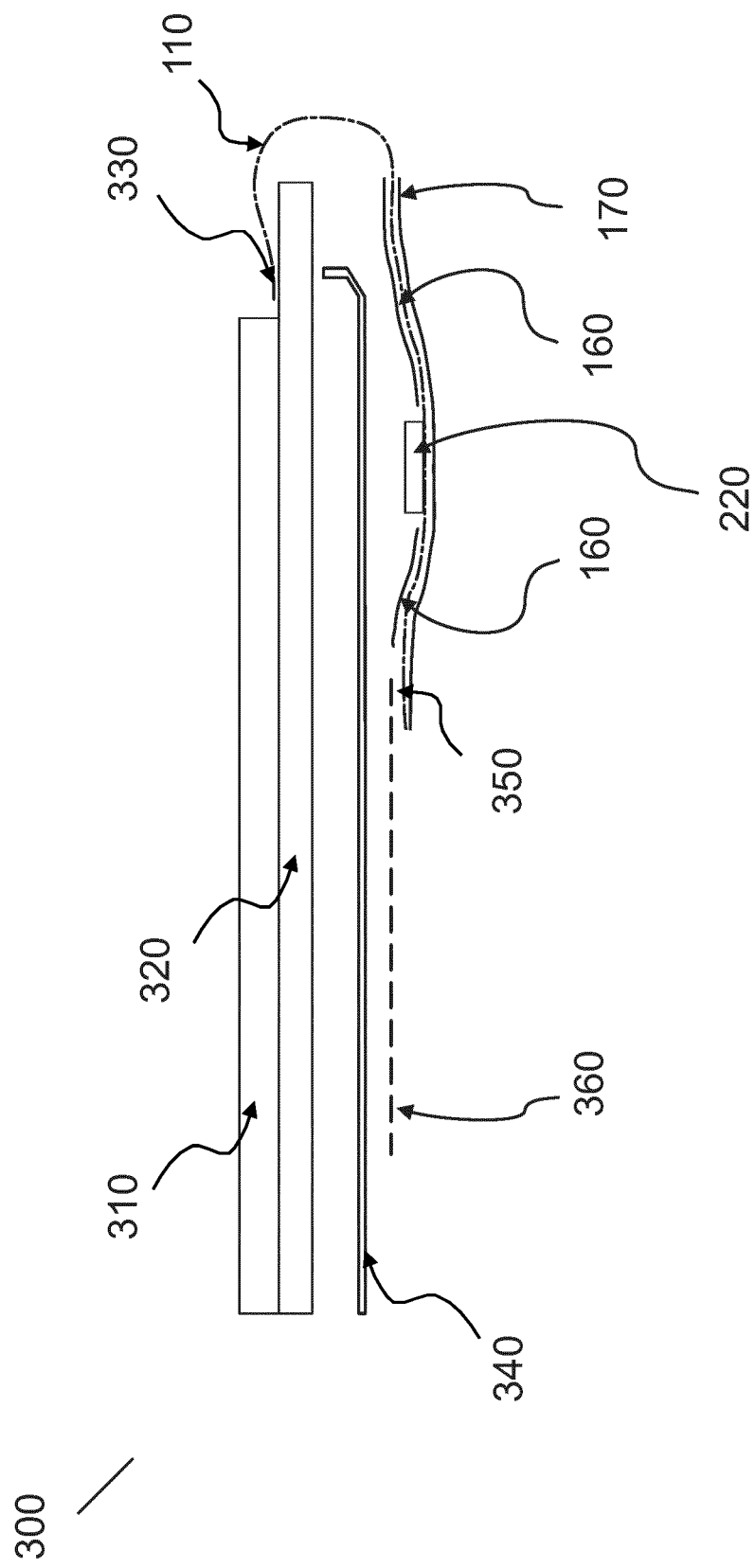
FIG. 3 illustrates a schematic representation of a display module in a cross-sectional view.

FIG. 2a illustrates another schematic representation of an assembly 100 for EMI shielding according to an example. While the assembly 100, particularly its adhesive geometry, corresponds to that of FIG. 1a, it should be understood that the assembly 100 of FIG. 1b, and the adhesive geometry in particular, can be applied also here.

In FIG. 2a, it is illustrated how the assembly 100 can also comprise an electronic component 220 attached on the FCB 110. The electronic component 220 may be an integrated circuit component. It may be, for example, a display driver or a display driver integrated circuit (DDIC). The electronic component 220 may be directly attached and electrically coupled to the circuit pattern layer 130. The first EMI shield, in particular the first conductive layer 160, may comprise an opening 210 for the electronic component 220. The opening 210 may extend all the way through the first EMI shield, including any adhesive layer 180. Due to the opening, the electronic component 220 may freely extend from the circuit pattern layer 130 through the first conductive layer 160 and, if necessary, also through the whole of the first EMI shield.

As an optional feature, FIG. 2a further illustrates the FCB 110 comprising two cavities 140 extending through the FCB 110 for electrically connecting the first conductive layer 160 and the second conductive layer 170. The two cavities 140 are positioned on the opposite sides of the electronic component 220, for example in the transverse or the longitudinal dimension of the FCB 110, to provide enhanced electromagnetic field geometry for shielding. The two cavities 140 may be of substantially equal size and/or shape. They may also have a substantially equal distance to the electronic component 220.

Additionally, and not necessarily in any relation with the electronic component 220, FIG. 2a illustrates also a configuration, where the FCB 110 is intact on its outer edge 102, i.e. the one or more cavities 140 are positioned inside the outer boundaries of the FCB 110. The outer edge 102 delimits the FCB 110 on one side in the x-y-plane. It should be understood that the assembly 100 may continue on the opposite side also beyond that what is illustrated in the figure.

Figure 2B:
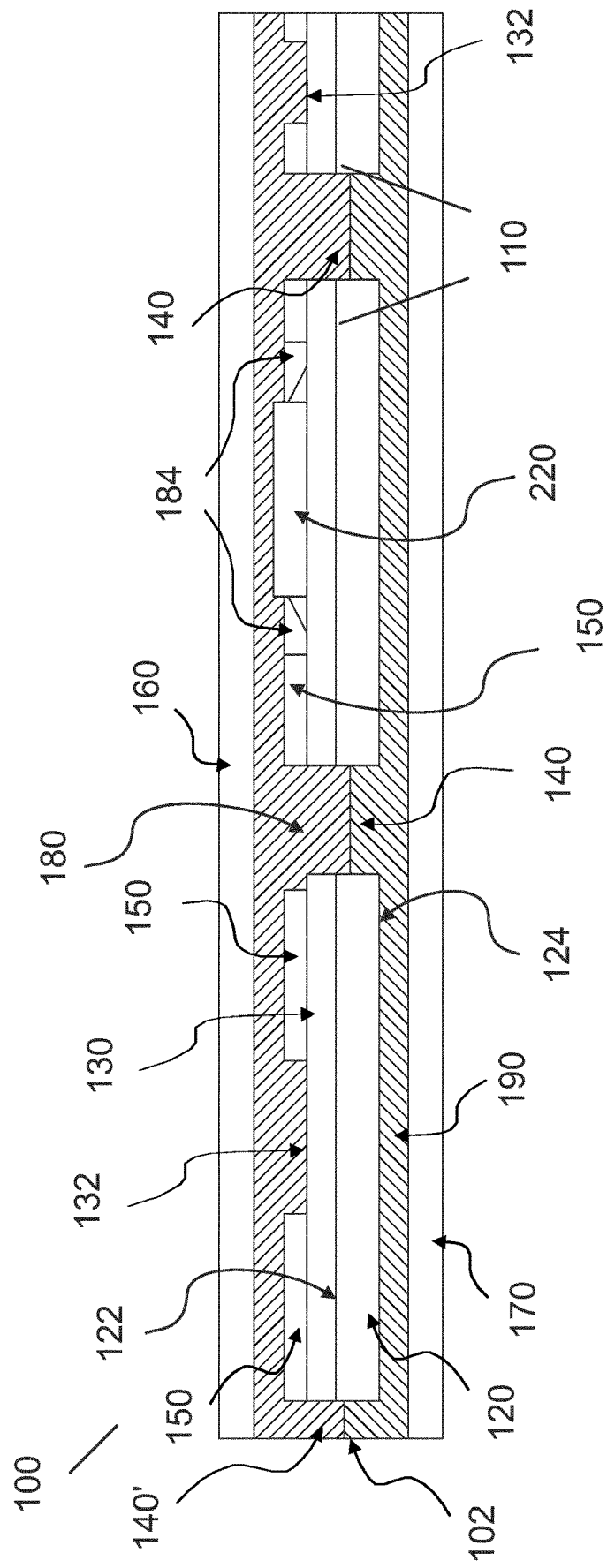

FIG. 2b illustrates another schematic representation of an assembly 100 for EMI shielding according to another example. While the assembly 100, particularly its adhesive geometry, corresponds to that of FIG. 1a, it should be understood that the assembly 100 of FIG. 1b, and the adhesive geometry in particular, can be applied also here.

Also in this assembly, an electronic component 220 is attached on the FCB 110 as described above. In contrast to the example of FIG. 2a, the electronic component 220 is completely covered by the first conductive layer 160, or the first EMI shield. In this example, the first conductive layer 160 and/or the first adhesive 180 below the first conductive layer 160 may be intact across the electronic component 220. For this purpose, the electronic component 220 may be smaller than that illustrated in FIG. 2a and/or the layer of first adhesive 180 between the circuit pattern layer 130 and the first conductive layer 160 may be thicker. Nevertheless, the electronic component 220 may be any of the components mentioned above for the example illustrated in FIG. 2a. In this example, the first adhesive 180 may be arranged so that it does not touch the circuit pattern layer 130 surrounding the electronic component 220. For example, a hollow region 184 an/or an insulation material may be arranged around the electronic component 220 for this purpose, or an insulating layer 150 may be arranged to extend all the way to the electronic component 220 to prevent the first adhesive 180 from entering between them.

Additionally, and not necessarily in any relation with the electronic component 220, FIG. 2a illustrates also a configuration, where the FCB 110 comprises a cavity 140' on its outer edge 102, i.e. some of the one or more cavities 140 are positioned on an outer boundary of the FCB 110.

FIG. 3 illustrates a schematic representation of a display module 300 according to an example. The display module 300 may be, for example, a liquid crystal display (LCD) module. The display module comprises a display panel 310, which may further comprise additional components 320 such as a backlight unit. The display panel 310 also comprises a first coupling region 330 for electrical connections to the display panel 310. The FCB 110 as described above may be attached to the first coupling region to provide electrical connections and/or control circuitry for the display panel 310. The attachment may be performed, for example, using anisotropic conductive film (ACF). An electrical component 220 such as a display driver integrated circuit (DDIC) may be attached on the FCB 110 as described above. Through the FCB 110, the whole assembly 100 for EMI shielding may be attached to the display panel 310. Depending on the configuration, the first and/or the second EMI shield, in particular the first conductive layer 160 and/or the second conductive layer 170 may extend longitudinally to wholly or partially cover the FCB 110.

The display module 300 may comprise a support structure 340 such as a display bezel, located on the back of the display panel 310. The support structure 340 may be metallic. While the first coupling region may be on the top side of the display panel 310 or at least on top with respect to the support structure 340, the flexibility of the FCB 110 allows the assembly 100 to be bent around the display panel 310 and/or the support structure 340. The bent may be substantially 180 degrees. The assembly 100 may thus be coupled to the display panel 310 with the top side of the FCB 110 facing the back of the display panel 310 and, if present, the support structure 340. The part of the assembly 100 arranged behind the display panel 310 may then be positioned substantially parallel with the display panel 310 and/or the support structure 340. In particular, the DDIC may be located in the part of the assembly 100 arranged behind the display panel 310. The first and/or the second EMI shield may be arranged only in the part of the assembly 100 arranged behind the display panel or they may extend also further, even covering the whole FCB 110.

The FCB 110 may be further coupled to other circuitry through a second coupling region 350, which may be arranged on the back side with respect to the display panel 310 and/or the support structure 340. For example, the FCB 110 may be coupled at a first end of the FCB 110 to the first coupling region 330 and at a second end of the FCB 110 to the second coupling region 350. The first end and the second end may be opposite ends of the FCB, for example in the longitudinal dimension of the FCB 110. It is specifically noted that due to the layer structure of the FCB 110, coupling at both ends may take be formed through the circuit pattern layer 130 on the top side of the FCB 110. However, due to one or more bends of the FCB 110, the circuit pattern layers 130 at the first and the second end of the FCB 110 may actually be facing in opposite directions, e.g. each other as is the case in the example illustrated in FIG. 3. In any case, additional electrical connections and/or control circuitry may be coupled to the FCB 110 through the second coupling region 350. This may include, for example, another FCB 360 such as a main FCB or main FPC of the display module 300. Typically, such other FCB's 360 may be positioned on the back side with respect to the display panel 310 and/or the support structure 340, for example substantially in parallel with either or both of them. However, the structure of the assembly 100 makes it possible that the first and second EMI shields need not be directly connected to any other FCB's 360 or to a metallic support structure 340 for electrical interconnections such as grounding connections. Instead, the shielding of the assembly 100 is embedded to the FPC 110 of the assembly 100 itself.

The assembly 100 and/or the display module 300 may be part of an apparatus such as a mobile phone, a smart phone, a computer tablet, a phablets, an augmented reality device, a virtual reality device or a television. The apparatus in the present context may be, for example, portable, pocket-storable, hand-held, computer-comprised or vehicle-mounted mobile device. The apparatus may also be a wearable, i.e. a device that may be worn by the user, such as a wrist-mounted device, a head-mounted device or an ankle-mounted device. In these devices, flexibility of materials and ability to adapt the circuitry in various configurations may be of particular advantage.

Figure 4:
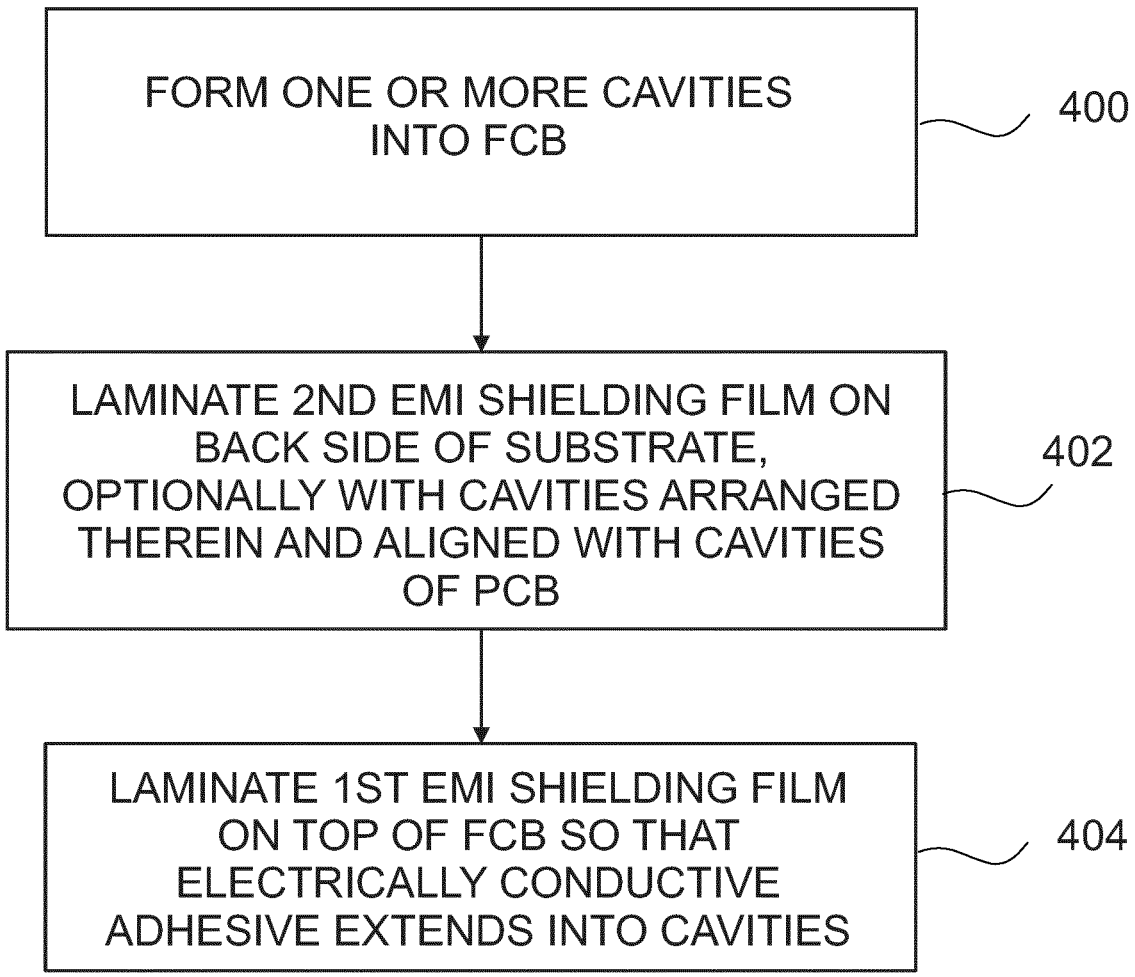
FIG. 4 illustrates a flowchart showing a method of forming an assembly for EMI shielding.

FIG. 4 illustrates a flowchart showing a method of forming an assembly 100 for EMI shielding. The first and/or second EMI shield may be provided as ready-for-use composite products such as layered EMI shielding films. The FCB 110 may be prepared beforehand. If the one or more cavities 140 extending through the FCB 110 are not made in pre-processing, they can be made 400 before lamination of the EMI shields, for example by punching. For this purpose, one or more dies of desired characteristics can be used. The method may also comprise removing parts of an insulating layer 150 of the FCB to expose the circuit pattern layer 130 for electrical connections and/or attaching one or more circuit elements 220 to the FCB 110.

If the second EMI shield comprises a layer of non-conductive adhesive, and if not already performed in pre-processing, one or more cavities 194 can be formed therein to expose the second conductive layer 170 for electrical connections. The second EMI shield is then laminated 402 on the back side of the FCB 110, e.g. directly on the back side 124 of the substrate 120. Naturally, the one or more cavities 194, if any, need to be aligned with the one or more cavities 140 of the FCB 110.

Depending on the circumstances, the first EMI shield may be laminated 404 before, after or simultaneously with the second EMI shield. The lamination process is performed so that the electrically conductive adhesive 180, 190, whether it being the first adhesive 180 and/or the second adhesive 190, extends into the one or more cavities 140 to form an electrically conductive connection between the connection region 132 and the second conductive layer 170 of the second EMI shield, through the first adhesive 180 and, optionally, the second adhesive 190 and/or the first conductive layer 160 of the first EMI shield.

It is noted that the assembly 100 may be formed before and/or after installation of any electronic components 220 on the FCB 110. This increases flexibility in manufacturing. After the assembly 100 has been formed, it may be attached to an apparatus, including a display module 300. This also needs not be the last step in the manufacturing process of the display module 300 so the display module 300 may be further augmented also after the assembly 100 has been attached thereto.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. An electrical device assembly comprising:
a flexible circuit board (FCB) comprising:
a substrate comprising a substrate top side and a substrate back side;
a circuit pattern layer disposed on the substrate top side, wherein the circuit pattern layer comprises a connection region for facilitating electrical interconnection to the FCB;
one or more first cavities extending through both the substrate and the circuit pattern layer;
a first conductive layer for electro-magnetic interference (EMI) shielding positioned on a top side of the FCB;
a second conductive layer for EMI shielding positioned on a back side of the FCB;
an anisotropic conductive adhesive (ACA) extending through the one or more first cavities and electrically connecting with the first conductive layer; and
an isotropic conductive adhesive (ICA) between the second conductive layer and the back side, wherein the ICA is disposed in contact with the ACA for facilitating electrical interconnection of the second conductive layer and the connection region.

2. The electrical device assembly of claim 1, wherein the FCB comprises a chip-on-flex (COF) film.

3. The electrical device assembly of claim 1, wherein a part of the electrically conductive adhesive between the circuit pattern layer and the first conductive layer comprises an isotropic conductive adhesive (ICA).

4. The electrical device assembly of claim 1, wherein the ICA is disposed in contact with the ACA for facilitating electrical interconnection of the second conductive layer and the connection region through the first conduction layer.

5. The electrical device assembly of claim 1, wherein the second conductive layer is attached to the back side of the substrate with a non-conductive adhesive, and wherein the non-conductive adhesive comprises one or more second cavities aligned with one or more first cavities.

6. The electrical device assembly of claim 1, wherein the first conductive layer comprises an opening for an electronic component attached to the circuit pattern layer.

7. The electrical device assembly of claim 1, further comprising an electronic component attached to the circuit pattern layer, wherein the electronic component is covered by the electrically conductive adhesive and the first conductive layer.

8. The electrical device assembly of claim 7, wherein the one or more first cavities comprise a plurality of cavities positioned on opposite sides of the electronic component.

9. The electrical device assembly of claim 1, wherein the electrically conductive adhesive comprises a pressure-sensitive film lamination on the FCB.

10. The electrical device assembly of claim 1, wherein the one or more first cavities comprise punched cavities.

11. The electrical device assembly of claim 1, wherein the one or more first cavities are circular.

12. The electrical device assembly of claim 1, wherein the one or more first cavities are positioned on an outer edge of the FCB and partially overlap the outer edge.

13. A display system comprising:
a flexible circuit board (FCB) comprising:
a substrate comprising a substrate top side and a substrate back side;
a circuit pattern layer disposed on the substrate top side, wherein the circuit pattern layer comprises a connection region for facilitating electrical interconnection to the FCB;
and
one or more first cavities extending through both the substrate and the circuit pattern layer;

a first conductive layer for electro-magnetic interference (EMI) shielding and positioned on a top side of the FCB;

a second conductive layer for EMI shielding and positioned on a back side of the FCB;

an anisotropic conductive adhesive (ACA) extending through the one or more first cavities and electrically connecting with the first conductive layer;

an isotropic conductive adhesive (ICA) between the second conductive layer and the back side, wherein the ICA is disposed in contact with the ACA for facilitating electrical interconnection of the second conductive layer and the circuit pattern layer;

a display panel coupled to the FCB such that the substrate top side faces the display panel and the substrate back side faces away from the display panel; and a display driver integrated circuit (DDIC) attached to the circuit pattern layer.

14. The display system of claim 13, further comprising an electronic component attached to the circuit pattern layer, wherein the electronic component is covered by the electrically conductive adhesive and the first conductive layer.

15. The display system of claim 14, wherein the one or more first cavities comprise a plurality of cavities positioned on opposite sides of the electronic component.

16. A method for electro-magnetic interference (EMI) shielding of a flexible circuit board (FCB), wherein the FCB comprises a substrate having a substrate top side and a substrate back side, and a circuit pattern layer disposed on the substrate top side, wherein the circuit pattern layer comprises a connection region for facilitating electrical interconnection for the FCB, and comprising one or more first cavities extending through both the substrate and the circuit pattern layer, wherein the EMI shielding method comprises:

laminating a first EMI shielding film comprising a first conductive layer on a top side of the FCB;

laminating a second EMI shielding film comprising a second conductive layer on a bottom side of the FCB;

applying an anisotropic conductive adhesive (ACA) on the top side of the FCB, wherein the ACA extends into the one or more first cavities and electrically connects the first conductive layer and the connection region; and applying an isotropic conductive adhesive (ICA) between the second conductive layer and the back side, wherein the ICA is disposed in contact with the ACA for facilitating electrical interconnection of the second conductive layer and the connection region.

17. The method of claim 16, further comprising forming the one or more first cavities by punching.

18. The method of claim 16, wherein the second EMI shielding film comprises a non-conductive adhesive, and wherein the method further comprises arranging one or more second cavities into the non-conductive adhesive in alignment with one or more first cavities for lamination.

19. The method of claim 16, further comprising:

affixing an electronic component attached to the circuit pattern layer; and covering the electronic component with the electrically conductive adhesive and the first conductive layer.

20. The method of claim 19, wherein the one or more first cavities comprise a plurality of cavities positioned on opposite sides of the electronic component.

* * * * *